(12) United States Patent
Zhang

(10) Patent No.: US 10,913,254 B2
(45) Date of Patent: Feb. 9, 2021

(54) METHOD FOR DEBONDING TEMPORARILY ADHESIVE-BONDED CARRIER-WORKPIECE PAIR BY USING CHEMICAL AND MECHANICAL MEANS

(71) Applicant: DIDREW TECHNOLOGY (BVI) LIMITED, San Jose, CA (US)

(72) Inventor: Chunbin Zhang, Fremont, CA (US)

(73) Assignee: DIDREW TECHNOLOGY (BVI) LIMITED, San Jose, CA (US)

( * ) Notice: Subject to any disclaimer, the term of this patent is extended or adjusted under 35 U.S.C. 154(b) by 0 days.

(21) Appl. No.: 15/916,263

(22) Filed: Mar. 8, 2018

(65) Prior Publication Data

US 2018/0264797 A1 Sep. 20, 2018

Related U.S. Application Data

(60) Provisional application No. 62/601,196, filed on Mar. 15, 2017.

(51) Int. Cl.
*B32B 43/00* (2006.01)
*H01L 21/67* (2006.01)
(Continued)

(52) U.S. Cl.
CPC ............ *B32B 38/10* (2013.01); *B32B 43/006* (2013.01); *C09J 5/00* (2013.01); *C09J 7/201* (2018.01); *H01L 21/6715* (2013.01); *H01L 21/6835* (2013.01); *H01L 21/6836* (2013.01); *H01L 21/7813* (2013.01); *B32B 43/003* (2013.01);
(Continued)

(58) Field of Classification Search
CPC . H01L 2221/68318; H01L 2221/68381; H01L 21/6836; Y10T 156/1111; Y10T 156/1184; Y10T 156/1967; Y10S 156/93; Y10S 156/941; B32B 43/006
See application file for complete search history.

(56) References Cited

U.S. PATENT DOCUMENTS 5,827,113 A * 10/1998 Okuno ................ B28D 5/0076
451/36
6,821,376 B1 11/2004 Rayssac
(Continued)

FOREIGN PATENT DOCUMENTS

WO WO-2016128079 A1 * 8/2016 ............. B26F 3/004

*Primary Examiner* — Mark A Osele
(74) *Attorney, Agent, or Firm* — Scully Scott Murphy & Presser

(57) ABSTRACT

In debonding a temporarily adhesive-bonded carrier-workpiece pair by a combination of chemical and mechanical methods, solvents or chemicals are used to remove the adhesives primarily through dissolution, and a thin wire, filament, or blade is used to exert a cutting or wedging action between the carrier and workpiece. The two methods are used together during the debonding process. In the carrier-workpiece pair, the workpiece can be a semiconductor wafer that has been thinned and processed. The carrier and the workpiece are temporarily bonded using an adhesive dissolvable in a selected chemical or solvent. The chemical and mechanical debonding (CMDB) method can be carried out in solvent immersion or in solvent spray to provide high throughput debonding. The dissolved adhesives can be recycled and later reused, thus lowering the cost of the whole bonding and debonding process.

20 Claims, 6 Drawing Sheets

(51) Int. Cl.
  *B32B 38/10* (2006.01)
  *C09J 7/20* (2018.01)
  *H01L 21/683* (2006.01)
  *H01L 21/78* (2006.01)
  *C09J 5/00* (2006.01)

(52) U.S. Cl.
  CPC ..... *B32B 2457/14* (2013.01); *C09J 2203/326* (2013.01); *C09J 2301/502* (2020.08); *H01L 21/67092* (2013.01); *H01L 2221/6834* (2013.01); *H01L 2221/68318* (2013.01); *H01L 2221/68327* (2013.01); *H01L 2221/68381* (2013.01); *Y10S 156/93* (2013.01); *Y10S 156/941* (2013.01); *Y10T 156/1111* (2015.01); *Y10T 156/1184* (2015.01); *Y10T 156/1967* (2015.01)

(56) References Cited

U.S. PATENT DOCUMENTS

| | | | | |
|---|---|---|---|---|
| 9,254,636 | B2* | 2/2016 | Price | B32B 43/006 |
| 9,381,732 | B2* | 7/2016 | Lindner | H01L 21/6835 |
| 9,387,548 | B2* | 7/2016 | Miyake | B23H 7/02 |
| 2002/0029849 | A1 | 3/2002 | Ohmi | |
| 2003/0010445 | A1 | 1/2003 | Yanagita | |
| 2003/0121601 | A1* | 7/2003 | Tajima | G09F 7/18 156/254 |
| 2007/0214649 | A1* | 9/2007 | Hess | B26B 27/002 30/116 |
| 2010/0107834 | A1* | 5/2010 | Lai | B23D 49/02 83/15 |
| 2010/0133373 | A1* | 6/2010 | Klabunde | B26D 1/547 242/407 |
| 2012/0000613 | A1* | 1/2012 | Thallner | H01L 21/67092 156/703 |
| 2012/0167733 | A1* | 7/2012 | Lee | B28D 5/0076 83/169 |
| 2012/0276818 | A1 | 11/2012 | Cramer | |
| 2016/0095268 | A1* | 3/2016 | Wang | G02F 1/1303 29/592.1 |
| 2016/0368069 | A1* | 12/2016 | Matsubara | B23H 7/104 |
| 2017/0018450 | A1* | 1/2017 | Tang | B05D 1/005 |
| 2018/0040489 | A1* | 2/2018 | Fehkuhrer | B26F 3/004 |

* cited by examiner

METHOD FOR DEBONDING TEMPORARILY ADHESIVE-BONDED CARRIER-WORKPIECE PAIR BY USING CHEMICAL AND MECHANICAL MEANS

TECHNICAL FIELD

Embodiments of this disclosure relate generally to bonding and debonding of carrier-workpiece pairs. In particular, various embodiments of debonding temprorarily bonded carrier-workpiece pairs by combination of chemical and mechanical methods are described.

BACKGROUND

In many applications, a workpiece needs to be thinned or processed with the support of a carrier to make the workpiece mechanically stable. The workpiece can be temporarily bonded to the carrier using adhesives. At end of the application, the workpiece needs to be debonded or separated from the carrier, and cleaned of any residue adhesives. For example, in semiconductor wafer thinning process, the workpiece can be a semiconductor wafer or device wafer on which thousands of chips are finally made. Widespread applications of smartphones, tablets, and portable consumer electronics are driving semiconductor packaging towards thinner, smaller, and more integrated directions. Wafer-level packaging (WLP) techniques is rapidly reducing the size of packages for easier integration into mobile electronics. The wafer thinning process used in device miniaturization and packaging has attracted more and more attention. Thin wafers offer the benefits of improved heat dissipation, three-dimensional (3D) stacking, reduced resistance, and substrate flexibility. In through silicon via (TSV) based 3D-IC wafer level packaging, wafers need to be thinned to less than 100 microns (μm). The thinning process needs to be high throughput and low cost to be suitable for volume production.

Wafer thinning is primarily achieved by mechanical grinding (back-grinding), polishing, and chemical etching. Thin wafers, especially ultra-thin wafers (thickness less than 60 microns or even 30 microns) are very unstable, and more susceptible to stress than traditional thick wafers. During processing, thin wafers may be easily broken and warped. Therefore, temporary bonding to a rigid support carrier is required. Thinned device wafers need to be supported for use on the backside in grinding process and subsequent processes such as photolithography, etching, plating, vacuum deposition, reactive ion etching, and so on.

SUMMARY

The present disclosure provides a novel method of debonding or separating a temporarily adhesive-bonded carrier-workpiece pair with the use of a combination of chemical and mechanical methods. The method can be used for processing various workpieces of different shapes such as round, rectangle, or square shapes, of different materials such as silicon, gallium arsenide, sapphire, glass, metal, of different thicknesses, in various applications where the workpieces can be optical lenses, semiconductors, liquid crystal displays (LCD), solar panels, and so on. The method is particularly useful for debonding temporarily adhesive-bonded semiconductor wafers in three-dimensional integrated circuit (3D-IC) semiconductor wafer level packaging.

The chemical and mechanical debonding (CMDB) method provided by this disclosure can advantageously enhance process efficiency, simplify procedures, provide high wafer throughput, and reduce or eliminate defects such as device wafer breakage and internal device damage. The method can greatly increase the range of selection of polymeric adhesives for the use of temporary workpiece bonding and debonding. The use of recyclable polymer adhesive such as thermoplastics is of particular benefit as it can greatly lower the overall cost.

In one aspect of the disclosure, a method of debonding a temporarily bonded carrier-workpiece pair comprises exposing the carrier-workpiece pair in an environment containing a chemical solvent capable of dissolving the adhesive, and exerting a cutting or wedging action to the adhesive with a mechanical component to separate the workpiece from the carrier.

The carrier-workpiece pair may be immersed in a chemical solvent capable of dissolving the adhesive. Alternatively, the carrier-workpiece pair may be sprayed with a chemical solvent capable of dissolving the adhesive.

The cutting or wedge action may be exerted with a wire or blade by moving the carrier-workpiece pair and/or the wire or blade relative to each other. The wire or blade may be in reciprocating saw motion during the moving of the carrier-workpiece pair and/or the wire or blade relative to each other.

The wire or blade may be made of a metal, a metal alloy, a metal coated with a polymer, a polymer, a natural product such as fiber, cloth, cotton, or ceramics, or a composite of different materials as long the materials do not damage the surface of the workpiece or carrier. The wire or blade may have a profile of a triangle, a polygon, a circle, an oval, a rectangle, or a square in cross-section transverse the length of the wire or blade or have a profile of a saw tooth in cross-section along a length of the wire or blade.

In another aspect of the disclosure, a method of debonding a temporarily bonded carrier-workpiece pair comprises exerting a cutting or wedging action to the adhesive in the carrier-workpiece pair with a wire or blade, and applying a lubricant to the carrier-workpiece pair while the cutting or wedging action is exerted to the adhesive with the wire or blade. The cutting or wedge action may be exerted with a wire or blade by moving the carrier-workpiece pair and/or the wire or blade relative to each other. The wire or blade may be in reciprocating saw motion during the moving of the carrier-workpiece pair and/or the wire or blade relative to each other. The wire or blade may be made of a metal, a metal alloy, a metal coated with a polymer, a polymer, a natural product such as fiber, cloth, cotton, or ceramics, or a composite of different materials as long the materials do not damage the surface of the workpiece or carrier. The workpiece in the carrier-workpiece pair may be a device wafer having a thickness of less than 100 microns, or less than 60 microns, or less than 30 microns.

This Summary is provided to introduce selected embodiments in a simplified form and is not intended to identify key features or essential characteristics of the claimed subject matter, nor is it intended to be used as an aid in determining the scope of the claimed subject matter. The selected embodiments are presented merely to provide the reader with a brief summary of certain forms the invention might take and are not intended to limit the scope of the invention. Other aspects and embodiments of the disclosure are described in the section of Detailed Description.

BRIEF DESCRIPTION OF THE DRAWINGS

These and various other features and advantages will become better understood upon reading of the following detailed description in conjunction with the accompanying drawings and the appended claims provided below, where:

DETAILED DESCRIPTION

Various embodiments of methods for debonding temprorarily bonded carrier-workpiece pair are described. It is to be understood that the disclosure is not limited to the particular embodiments described. An aspect described in conjunction with a particular embodiment is not necessarily limited to that embodiment and can be practiced in any other embodiments.

Various embodiments are described with reference to the figures. It should be noted that some figures are not necessarily drawn to scale. The figures are only intended to facilitate the description of specific embodiments, and are not intended as an exhaustive description or as a limitation on the scope of the disclosure. Further, in the figures and description, specific details may be set forth in order to provide a thorough understanding of the disclosure. It will be apparent to one of ordinary skill in the art that some of these specific details may not be employed to practice embodiments of the disclosure. In other instances, well known components may not be shown or described in detail in order to avoid unnecessarily obscuring embodiments of the disclosure.

All technical and scientific terms used herein have the meaning as commonly understood by one of ordinary skill in the art unless specifically defined otherwise. As used in the description and appended claims, the singular forms of "a," "an," and "the" include plural references unless the context clearly dictates otherwise. The term "or" refers to a nonexclusive "or" unless the context clearly dictates otherwise.

As used herein, the terms "temporarily bonded," "temporary bonding," and their grammatical equivalents, refer to embodiments where the bonding between a carrier and a workpiece is temporary and will be removed upon completion of one or more processing steps on the workpiece.

Figure 1:
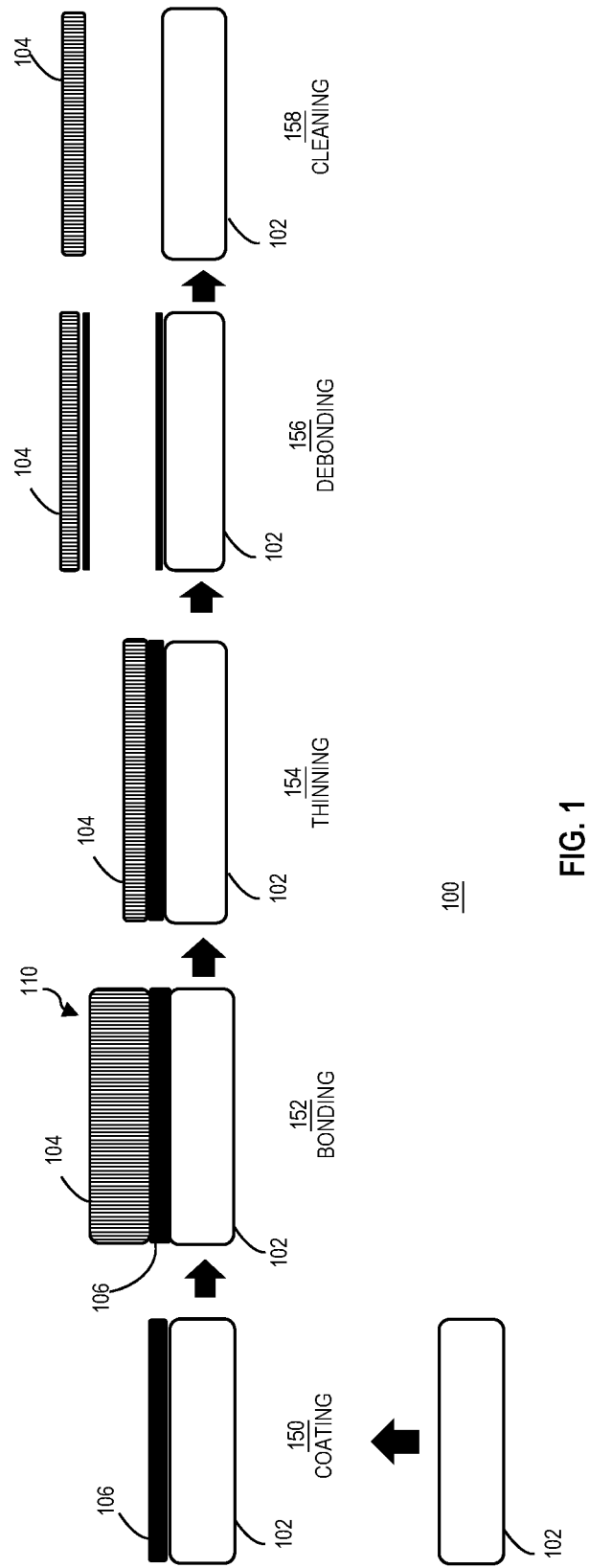
FIG. 1 schematically illustrates a process of temporarily bonding and debonding a carrier-workpiece pair according to embodiments of the disclosure.

FIG. 1 schematically illustrates a process 100 of temporarily bonding and debonding a carrier-workpiece pair according to embodiments of the disclosure. As shown, a carrier 102 can be coated with an adhesive 106 at step 150. A workpiece 104, which may have been applied with a protective layer (not shown), can be temporarily bonded with the adhesive-coated carrier 102 at step 152, forming a temporarily bonded carrier-workpiece pair 110. The temporarily bonded carrier-workpiece pair 110 can be formed by contacting the workpiece 104 facedown with the adhesive-coated carrier 102 under vacuum or pressure. The workpiece 104, which is supported by the carrier 102 through the bonding of the adhesive 106, can be then thinned and/or further processed from the backside, as shown at step 154. Once the thinning and/or other processing are completed, the workpiece 104 can be debonded, or separated, from the carrier 102, as shown at step 156. The workpiece 104 and carrier 102 can be then cleaned at step 158.

The workpiece 104 can be a semiconductor device wafer, an optical lens, quartz, a sapphire wafer, display glass, an LED crystal, a thin metal plate, a thin membrane, a film, or the like. The workpiece 104 can be made of silicon, polysilicon, silicon oxide, silicon-germanium, silicon nitride, gallium arsenide, gallium nitride, gallium phosphide, alumina titanium carbide, or silicon carbon. The workpiece 104 can also be metals such as copper, aluminum, steel, gold, tungsten, tantalum, low K dielectrics, metal nitrides, metal alloys, silicides, and any combination thereof. Indeed, any suitable workpiece made of any materials in any form can be used in the method of this disclosure.

The carrier 102 can be any suitable carrier that has sufficient mechanical strength. The carrier 102 can be made of the same material as that of the workpiece 104. In semiconductor temporary wafer bonding and debonding process, the carrier 102 can be made of silicon, glass, etc. During the debonding step 156 using such as chemical and mechanical debonding method as will be described below, the carrier 102 can be applied with a certain degree of pulling force to facilitate separation of the carrier from the workpiece.

Suitable adhesives 106 that can be used in the temporary bonding process include thermoplastic polymers. Polymers of slight crosslinking and still solvable in a solvent may still be used. In some embodiments, thermoplastic polymeric adhesives are preferred because they can be recycled and reused after post debonding reclaim treatment, and therefore the total cost of the whole bonding and debonding process can be greatly reduced. Any suitable polymers can be used so long they meet the specifications as required by the processing conditions such as low outgassing, film uniformity, solubility in solvents, temperature tolerance, etc. The polymers can be polyimides, rubbers, cyclic olefins, polyacrylates, poly methyl methacrylate, polyurethanes, polycarbonates, polyethylene terephthalate, cellulose, polyesters, polystyrenes, epoxies, silicones, polyamides, polysulfones, etc. or combination thereof. Photoresists such as those manufactured by JSR Corporation of Japan and AZ series photoresists manufactured by AZ Electronic Materials (Merck) of Germany can also be used. In some embodiments, the polymers can be used in formulations which contain polymers as binders and other fillers and additives such as antioxidants, plasticizers. In some embodiments, single polymers are preferred for ease of recycling and reuse of the polymers.

The polymeric adhesives 106 can be applied to the carrier 102 using spin coating, spray coating, slot coating, knife coating, and other available coating techniques from solutions. The polymeric adhesives 106 can also be applied in dry film lamination. The adhesives 106 should form as uniform films as possible. Bonding of a workpiece such as a device wafer to a carrier wafer coated with adhesives can be accomplished with bonders commercially available from e.g. EVG of Austria, Suss MicroTec of Germany, Tokyo Electron Ltd. of Japan, and other companies, or inhouse made bonders. In some embodiments, the thickness of the polymer adhesive coated on the carrier may range from 1 to 500 microns.

The adhesive bonded carrier-workpiece pair 110 such as a device wafer-carrier wafer pair can be safely subjected to thinning such as back-grinding and chemical-mechanical polishing (CMP). By way of example, a device wafer 104 may be thinned to have a thickness of less than 100 microns. In some applications, a device wafer 104 may be thinned to have a thickness of less than 60 microns or even 30 microns. After thinning, other backside processing can be carried out too, such as through silicon via (TSV) formation, etching such as deep reactive-ion etching (DRIE), metal and dielectric deposition, patterning such as photolithography, via etching, plasma ashing, bonding pads, passivating, annealing, and any combinations thereof. After these processes, the device wafer 104 is ready to be debonded or separated from the carrier wafer 102 and cleaned of the adhesive.

The debonding step 156 can be critical. It is desirable that the debonding step is high throughput, defect less, damage less, and cost effective. The present disclosure provides a chemical and mechanical debonding (CMDB) method, which can enhance process efficiency, simplify procedures, provide high wafer throughput, and reduce or eliminate defects such as device wafer breakage and internal device damage. The debonding method provided by the disclosure also greatly increases the range of selection of polymeric adhesives for use in temporary bonding and debonding as a result of solvent use. The use of recyclable thermoplastics is of particular benefit as it can greatly lower the overall cost. The disclosed debonding method allows separation of the workpiece from the carrier and cleaning to be combined into one integrated step to provide high throughput and lower costs.

In accordance with embodiments of the disclosure, a temporarily adhesive-bonded carrier-workpiece pair can be debonded or separated using a combination of chemical and mechanical means. The carrier-workpiece pair temporarily bonded with an adhesive can be exposed in an environment containing a chemical solvent capable of dissolving the adhesive. A mechanical component may exert a cutting or wedging action to the adhesive to separate the workpiece from the carrier. The carrier-workpiece pair temporarily bonded with the adhesive may be exposed to the chemical solvent by immersing the carrier-workpiece pair in the solvent, or by spraying the carrier-workpiece pair with the solvent. The mechanical component can be a wire, filament, or blade with a suitable cross-sectional profile.

In the chemical and mechanical debonding method of the disclosure, the chemical solvent or solvents used can be a single solvent or a combination of several solvents. The selection of solvents may be dictated by the use of polymer adhesives. The selection of a solvent to a particular polymer generally can be based on the "like dissolves like" principal. Solubility parameter is a factor to consider for selection of a solvent or combination of solvent mixtures. The solvent can also be in the form of a formulation. Many of stripping solutions used in the microelectronics industry can be used. Suitable solvents include n-methylpyrrolidone (NMP), dimethyl sulfoxide (DMSO), ethyl lactate ethyl acetate, butyl acetate, methyl ethyl ketone (MEK), propylene glycol methyl ethylene acetate (PGMEA), acetone, cyclopentenone, tetrahydrofuran (THF), dimethyl acetamide, hydrocarbons, cyclic hydrocarbons, or strippers made of these solvents as main components. Examples of photoresist removers and strippers include AZ100, Technistrip P1316, P1331, NI555, etc. For example, NMP can be used if polyimide type polymer "durimide" made by Fujifilm Holdings Corporation is used as the temporary bonding adhesive. Water-containing solvents (water content between 0 to 100 percent) can also be used for environmental considerations so long they can carry the adhesive away during chemical and mechanical debonding.

In the chemical and mechanical method for debonding a temporarily adhesive-bonded carrier-workpiece pair such as a device wafer-carrier wafer pair, the mechanical mode may dictate the overall speed of debonding. High throughput is desirable for volume production in 3D-IC manufacturing. According to embodiments of the disclosure, the cutting or wedge action can be exerted by a mechanical component such as a thin wire, thin filament, thin blade, or thin saw. The mechanical component or components should be thin so it they do not cause mechanical damage to the workpiece such as the device wafer during debonding. The wire, filament, or blade can be made of synthetic polymers, natural polymers, metals, ceramics, or combination thereof. An example of the mechanical component is a metal wire coated with polymers. Metal wires, filaments, or blades can be made of copper, gold, silver, stainless steel, tungsten, etc. The thickness of the wire, filament, or blade is preferably less than 5 mm, more preferably less than 1 mm. In some preferred embodiments, the outer surface of the wire, filament, or blade is coated with polymers to avoid scratching or damaging of the surfaces of the workpiece and/or the carrier during mechanical movement. When wires, filaments, or blades comprising polymer coatings are used, the polymers should be selected to not affect the chemical solvents for dissolving the adhesive. Examples of polymer wires include dental floss or filaments made of Nylon (polyamide), and Teflon. The wires, filaments, and blades can be made of other polymers such as polypropylene, silk, cotton, and other fluorinated polymers.

Figure 5:
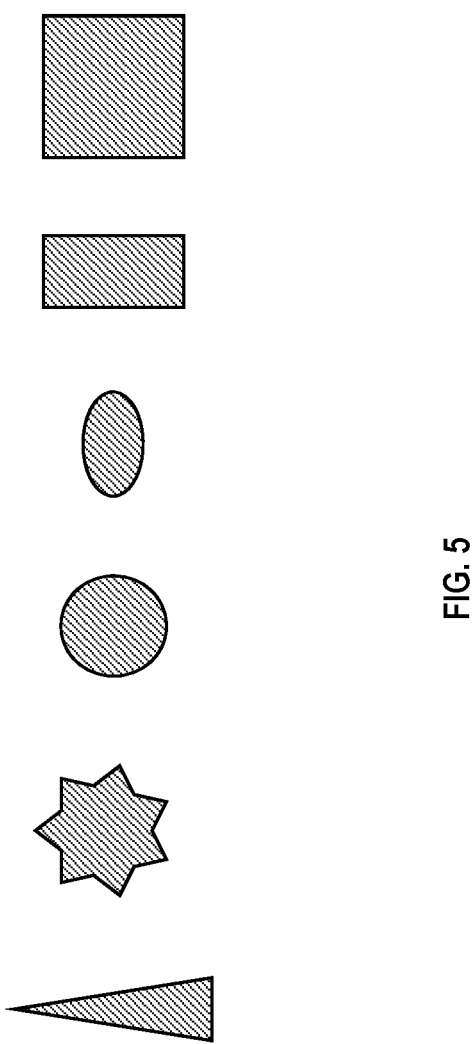
FIG. 5 shows profiles of exemplary mechanical components in cross-section transverse the length of the mechanical components which can be used in the debonding method according to embodiments of the disclosure.

FIG. 5 shows profiles of exemplary mechanical components in cross-section transverse the length of the mechanical components which can be used in the debonding method according to embodiments of the disclosure. As shown, the wire, filament, blades, or saw may have various suitable profiles in cross-section transverse the length of the components, such as a triangular, polygonal, circular, oval, rectangular, or square shape. Other regular or irregular profiles in cross-section transverse the length of the mechanical component can also be used so long it gives cutting or wedging action to the carrier-workpiece pair without any detrimental effects.

Figure 6:
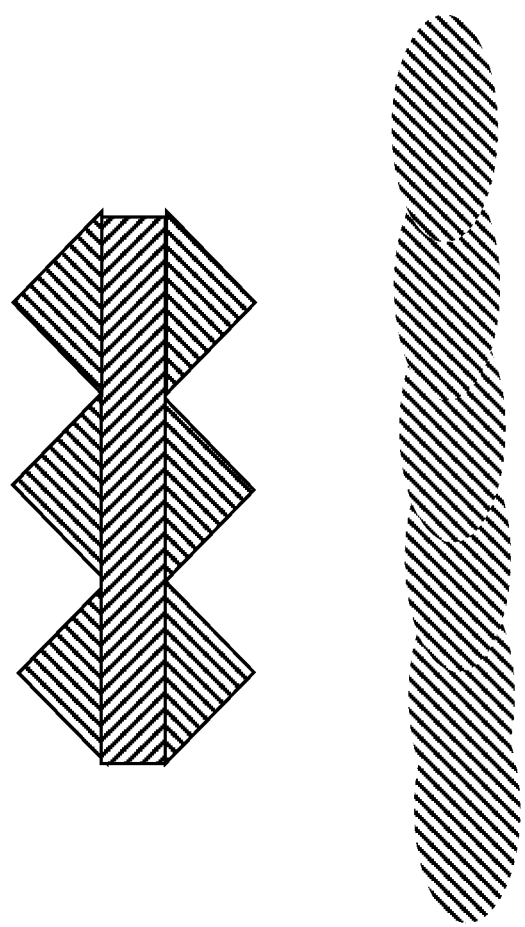
FIG. 6 shows profiles of exemplary mechanical components in cross-section along the length of the mechanical components which can be used in the debonding method according to embodiments of the disclosure.

FIG. 6 shows profiles of exemplary mechanical components in cross-section along the length of the mechanical components which can be used in the debonding method according to embodiments of the disclosure. As shown, the wire, filament, or blade may have a profile of a saw tooth in cross-section along a length of the component. Other regular or irregular profiles in cross-section along the length of mechanical component may also be used.

The mechanical component such as a wire, filament, or blaze exerts a cutting or wedging action to the adhesive between the carrier and the workpiece as the carrier-workpiece pair and/or the mechanical component move relative to each other. In applications, the mechanical component may be moved towards the stationary carrier-workpiece pair to exert a cutting or wedging action to the adhesive, or the carrier-workpiece pair may be moved towards the stationary mechanical component while exerting a cutting or wedging action to the adhesive. Alternatively, both the carrier-workpiece pair and the mechanical component may be moved simultaneously towards each other to increase the speed of the debonding process. In various embodiments, the mechanical component such as a wire, filament, or blade may be in a reciprocating saw motion during the relative moving of the carrier-workpiece pair and the mechanical component. The moving direction of the mechanical component should be tangential to the surface of the workpiece and/or the carrier to avoid scratching or damaging of the workpiece and/or the carrier.

Figure 2:
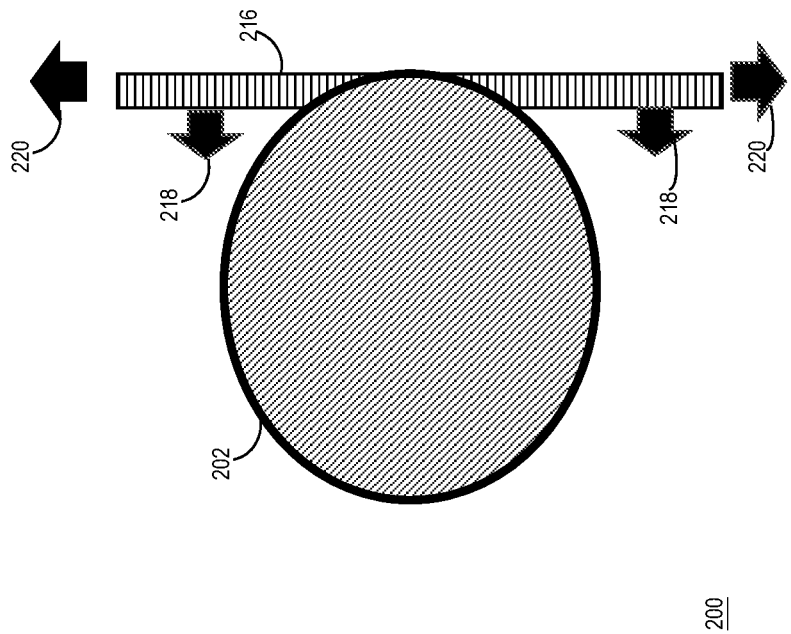
FIG. 2 schematically illustrates a method of debonding a temporarily bonded carrier-workpiece pair according to an exemplary embodiment of the disclosure.
Figure 2:
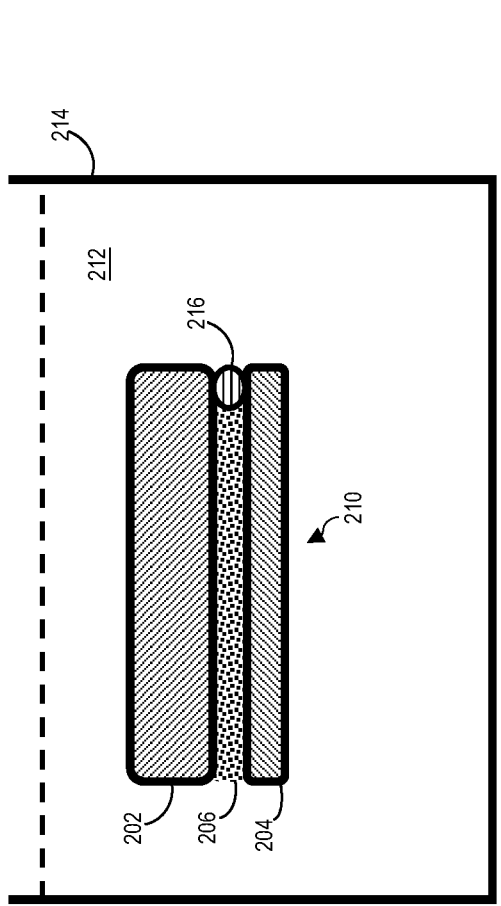

FIG. 2 schematically illustrates a method 200 of debonding a temporarily bonded carrier-workpiece pair 210 according to an embodiment of the disclosure. For illustration purpose, the temporarily bonded carrier-workpiece pair 210 may include a carrier wafer 202 and a device wafer 204 temporarily bonded by a layer of an adhesive 206. The device wafer 204 may be a thinned device wafer having a thickness of e.g. less than 100 microns, or less than 60 microns. The carrier wafer 202 may be made of e.g. silicon, glass, etc. The adhesive 206 that temporarily bonds the carrier wafer 202 and the device wafer 204 may be a thermoplastic polymer.

FIG. 2 on the left shows a view of a cross-section of the carrier wafer-device wafer pair 210 positioned in a horizontal orientation whereas on the right shows a view from the top of the carrier wafer 202. As shown, the adhesive-bonded carrier wafer-device wafer pair 210 may be immersed in a solvent 212 in a container 214, exposing the carrier wafer-device wafer pair 210 to the solvent 212 capable of dissolving the adhesive 206. A thin wire or blade 216, which can be held at the two ends of the wire or blade, can be aimed at the adhesive 206 between the carrier wafer 202 and the device wafer 204. As the adhesive 206 is dissolved by the solvent 212 from the edge, the thin wire or blade 216 can be caused to move in a direction across or parallel to the surface of the carrier wafer 202, as indicated by arrows 218. Alternatively, carrier wafer-device wafer pair 210 may be caused to move against the thin wire or blade 216. At the same time, the thin wire or blade 216 may be moved in a reciprocating saw motion mode, as indicated by arrows 220. The reciprocating saw motion may create a turbulent flow during adhesive dissolution by the solvent. This can greatly increase the debonding speed.

Figure 3:
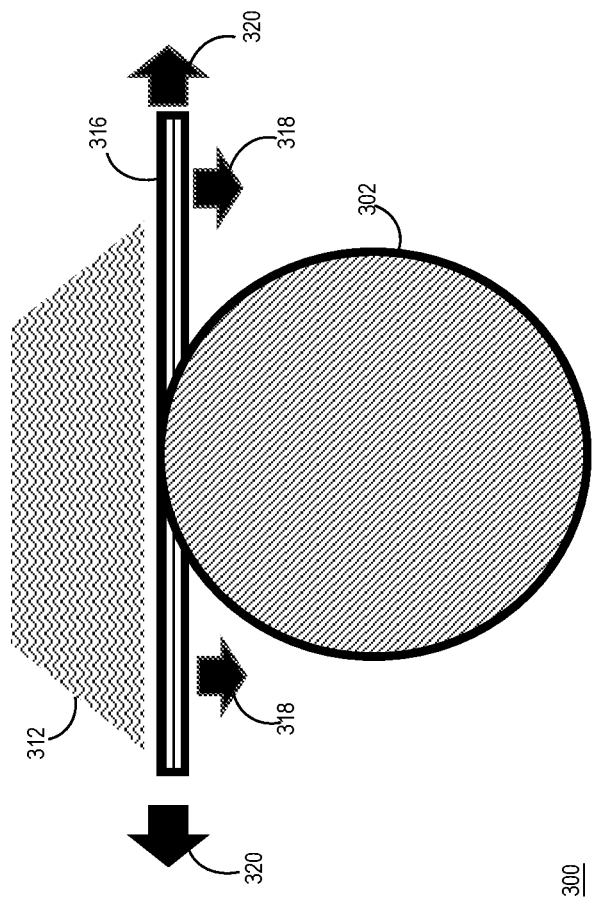
FIG. 3 schematically illustrates a method of debonding a temporarily bonded carrier-workpiece pair according to another exemplary embodiment of the disclosure.
Figure 3:
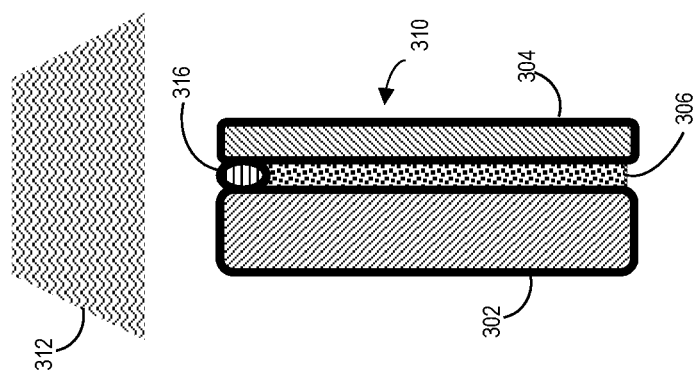

FIG. 3 schematically illustrates a method 300 of debonding a temporarily bonded carrier-workpiece pair 310 according to another embodiment of the disclosure. For illustration purpose, temporarily bonded carrier-workpiece pair 310 may include a carrier wafer 302 and device wafer 304 temporarily bonded by an adhesive 306. The device wafer 304 may be a thinned device wafer having a thickness of e.g. less than 100 microns, or less than 60 microns. The carrier wafer 302 may be made of e.g. silicon, glass, etc. The adhesive 306 that temporarily bonds the carrier wafer 302 and the device wafer 304 may be a thermoplastic polymer.

FIG. 3 on the left shows a view of a cross-section of the carrier wafer-device wafer pair 310 positioned in a vertical orientation whereas on the right shows a view from the side of the carrier wafer 302. As shown, the adhesive-bonded carrier wafer-device wafer pair 310 is exposed to a solvent spray 312 capable of dissolving the adhesive 306. For example, the solvent spray 312 may continuously apply to an edge portion of the carrier wafer-device wafer pair 310, allowing the adhesive 306 to be exposed to the solvent. A thin wire or blade 316, which can be held at the two ends of the wire or blade, can be aimed at the adhesive 306 between the carrier wafer 302 and the device wafer 304. As the adhesive 306 is dissolved by the solvent spray 312 from the edge portion of the carrier wafer-device wafer pair 310, the thin wire or blade 316 can be caused to move in a direction across or parallel to the surface of the carrier wafer 302, as indicated by arrows 318. Alternatively, carrier wafer-device wafer pair 310 may be caused to move against the thin wire or blade 316. At the same time, the thin wire or blade 316 may be applied a reciprocating saw motion to the adhesive, as indicated by arrows 320. The reciprocating saw motion may create a turbulent flow during adhesive dissolution by the solvent. This can greatly increase the debonding speed. When solvents are used in a spray mode, the pressure of the solvent spray may range from 0 to 3000 psi. Due to the use of mechanical perturbation or cutting, the solvents can also act as adhesive removers. While the solvent can be sprayed under a high pressure, spraying under high pressure is not required. In some embodiments for environmental considerations, water-containing solvents (water content between 0 to 100 percent) can be used so long they can carry the adhesive away during chemical and mechanical debonding.

Figure 4:
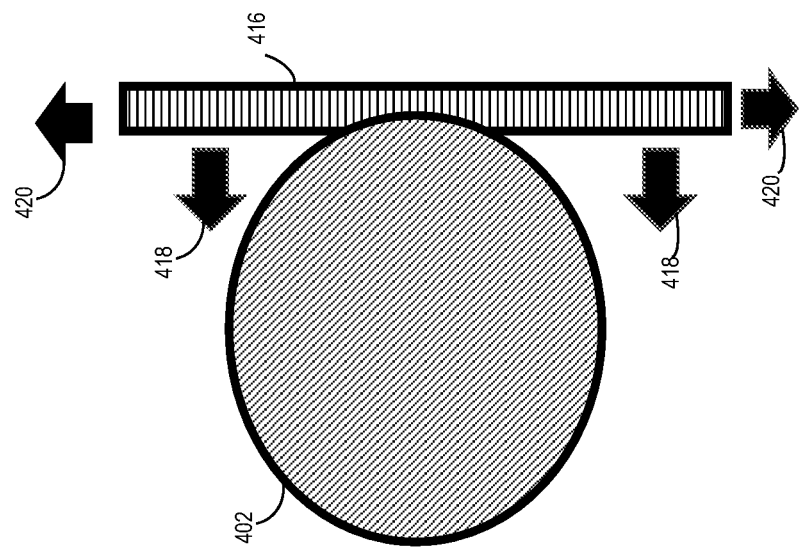
FIG. 4 schematically illustrates a method of debonding a temporarily bonded carrier-workpiece pair according to a further exemplary embodiment of the disclosure.
Figure 4:
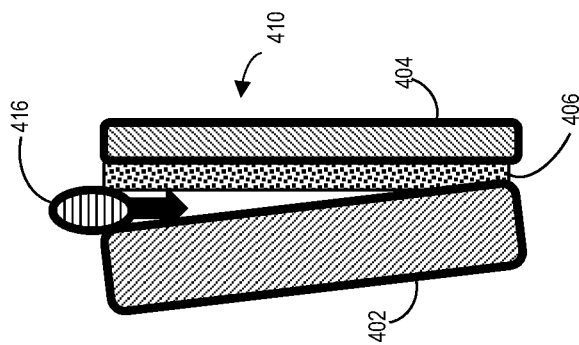

FIG. 4 schematically illustrates a method of debonding a temporarily bonded carrier-workpiece pair 410 according to a further embodiment of the disclosure. For illustration purpose, temporarily bonded carrier-workpiece pair 410 may include a carrier wafer 402 and a device wafer 404 temporarily bonded by a layer of adhesive 406. The device wafer 404 may be a thinned device wafer having a thickness of e.g. less than 100 microns, or less than 60 microns. The carrier wafer 402 may be made of e.g. silicon, glass, etc. The adhesive 406 that temporarily bonds the carrier wafer 402 and the device wafer 404 may be a thermoplastic polymer.

FIG. 4 on the left shows a view of a cross-section of the carrier wafer-device wafer pair 410 positioned in a vertical orientation whereas on the right shows a view from the side of the carrier wafer 402. Different from the embodiments shown in FIGS. 2 and 3, in the embodiment shown in FIG. 4, the carrier wafer-device wafer pair 410 may not be exposed to a chemical solvent capable of dissolving the adhesive. Instead, a lubricant such as water or any other suitable lubricant such as glycerine, mineral oil, or the like may be applied along the edges of the carrier wafer -device wafer pair 410. A thin wire or blade 416, which can be held at the two ends of the wire or blade, can be aimed at the adhesive 406 between the carrier wafer 402 and the device wafer 404, and caused to move in a direction across or parallel to the surface of the carrier wafer 402, as indicated by arrows 418, exerting a cutting or wedging action to the adhesive 406. Alternatively, the carrier wafer-device wafer pair 410 may be caused to move against the thin wire or blade 416. At the same time, the thin wire or blade 416 may be applied a reciprocating saw motion, as indicated by arrows 420. During the mechanical mode, a lubricant such as water can be applied to carry the adhesive away or cool down the carrier wafer -device wafer 410 and/or the thin wire or blade 416.

Embodiments of debonding temprorarily bonded carrier-workpiece pairs have been described. Those skilled in the art will appreciate that various other modifications may be made. All these or other variations and modifications are contemplated by the inventors and within the scope of the invention.

What is claimed is:
1. A debonding method comprising:
exposing a carrier-workpiece pair comprising a carrier, a workpiece and an adhesive bonding the carrier and the workpiece, to a chemical solvent selected to dissolve the adhesive, wherein exposing the carrier-workpiece pair to the chemical solvent comprises immersing the carrier-workpiece pair in the chemical solvent to engage the chemical solvent with an exposed edge of the adhesive to dissolve the exposed edge of the adhesive; and simultaneously with the engagement of the chemical solvent with the exposed edge of the adhesive to dissolve the exposed edge of the adhesive, engaging a wire with the exposed edge of the adhesive and moving the wire relative to the exposed edge of the adhesive to generate turbulent flow action to increase dissolution rate of the chemical solvent.

2. The debonding method of claim 1,
wherein moving the wire relative to the exposed edge of the adhesive to generate turbulent flow action to increase dissolution rate of the chemical solvent comprises moving at least one of the wire and the carrier-workpiece pair in a reciprocating saw motion.

3. The debonding method of claim 1,
wherein the adhesive comprises a thermoplastic polymer adhesive.

4. The debonding method of claim 1,
wherein the workpiece comprises at least one of a semiconductor wafer, an optical lens, quartz, a sapphire wafer, display glass, a liquid crystal display, a thin metal plate, a thin membrane, and a film.

5. The debonding method of claim 1,
wherein the workpiece has a thickness of less than 100 microns.

6. The debonding method of claim 1,
wherein the wire has a profile of a triangular, polygonal, circular, oval, rectangular, or square shape in cross-section transverse a length thereof.

7. The debonding method of claim 1,
wherein the wire has a profile of a saw tooth shape in cross-section along a length thereof.

8. The debonding method of claim 1, wherein the wire has a profile of a saw tooth shape in cross-section along a length thereof.

9. A debonding method comprising:
spraying a carrier-workpiece pair comprising a carrier, a workpiece and an adhesive bonding the carrier and the workpiece, with a lubricant to engage the lubricant with an exposed edge of the adhesive; and simultaneously with the engagement of the lubricant with the exposed edge of the adhesive, engaging a wire with the exposed edge of the adhesive and moving the wire relative to the exposed edge of the adhesive to remove parts of the adhesive from the carrier-workpiece pair and allow the lubricant to carry the parts of the adhesive removed and to cool the carrier and the workpiece as the carrier-workpiece is being debonded.

10. The debonding method of claim 9,
wherein the workpiece has a thickness of less than 100 microns.

11. The debonding method of claim 10,
wherein workpiece comprises a device wafer.

12. The debonding method of claim 9, wherein the wire has a profile of a triangular, polygonal, circular, oval, rectangular, or square shape in cross-section transverse a length thereof.

13. The debonding method of claim 9,
wherein the wire has a profile of a saw tooth shape in cross-section along a length thereof.

14. The debonding method of claim 9,
wherein moving the wire relative to the exposed edge of the adhesive comprises moving at least one of the wire and the carrier-workpiece pair in a reciprocating saw motion.

15. The debonding method of claim 9,
wherein the adhesive comprises a thermoplastic polymer adhesive.

16. The debonding method of claim 9,
wherein the workpiece comprises at least one of a semiconductor wafer, an optical lens, quartz, a sapphire wafer, display glass, a liquid crystal display, a thin metal plate, a thin membrane, and a film.

17. The debonding method of claim 9,
wherein the lubricant comprises at least one of water, glycerin and mineral oil.

18. A debonding method comprising:
exposing a carrier-workpiece pair comprising a carrier, a workpiece and an adhesive bonding the carrier and the workpiece, to a chemical solvent selected to dissolve the adhesive, wherein exposing the carrier-workpiece pair to the chemical solvent comprises continuously spraying the chemical solvent on the carrier-workpiece pair to engage the chemical solvent with the exposed edge of the adhesive to dissolve the exposed edge of the adhesive; and simultaneously with the engagement of the chemical solvent with the exposed edge of the adhesive to dissolve the exposed edge of the adhesive, engaging a wire with the exposed edge of the adhesive and moving the wire relative to the exposed edge of the adhesive to generate turbulent flow action to increase dissolution rate of the chemical solvent.

19. The debonding method of claim 18,
wherein moving the wire relative to the exposed edge of the adhesive to generate turbulent flow action to increase dissolution rate of the chemical solvent comprises moving at least one of the wire and the carrier-workpiece pair in a reciprocating saw motion.

20. The debonding method of claim 18,
wherein the wire has a profile of a triangular, polygonal, circular, oval, rectangular, or square shape in cross-section transverse a length thereof.

* * * * *